United States Patent
Haefner et al.

(10) Patent No.: US 9,638,718 B2
(45) Date of Patent: May 2, 2017

(54) ATE THERMAL OVERLOAD DETECTION AND RECOVERY TECHNIQUES

(71) Applicant: Advantest Corporation, Tokyo (JP)

(72) Inventors: Ralf Haefner, Holzgerlingen (DE); Claus Ploetz, Wildberg (DE)

(73) Assignee: Advantest Corporation, Tokyo (JP)

( * ) Notice: Subject to any disclaimer, the term of this patent is extended or adjusted under 35 U.S.C. 154(b) by 98 days.

(21) Appl. No.: 14/703,105

(22) Filed: May 4, 2015

(65) Prior Publication Data

US 2016/0109485 A1    Apr. 21, 2016

Related U.S. Application Data

(60) Provisional application No. 62/034,679, filed on Aug. 7, 2014.

(51) Int. Cl.
*G01R 1/36* (2006.01)
*G01K 7/00* (2006.01)
*G01R 1/02* (2006.01)
*G01K 13/00* (2006.01)

(52) U.S. Cl.
CPC ........... *G01R 1/36* (2013.01); *G01K 7/00* (2013.01); *G01K 13/00* (2013.01); *G01R 1/02* (2013.01)

(58) Field of Classification Search
USPC ........................................ 324/750.01–750.04
See application file for complete search history.

(56) References Cited

U.S. PATENT DOCUMENTS

2015/0168486 A1* 6/2015 Isaac .................. G01R 31/2889
324/756.02

OTHER PUBLICATIONS

ADT7461 Temperature Monitor Data Sheet, Semiconductor Components Industries, LLC, Mar. 2014.
EVAL-ADT7461 Temperature Monitor Data Sheet, Analog Devices Inc., 2004.

* cited by examiner

*Primary Examiner* — Vincent Q Nguyen

(57) ABSTRACT

A system including an automated test equipment (ATE) and an interface board. The interface board includes a temperature monitor that compares a sensor temperature to a predetermined temperature. The associated temperature sensor may be located near one or more selected components on the device under test or the interface board. If the sensor temperature exceeds the predetermined temperature the temperature monitor turns off one or more power supplies of the ATE.

20 Claims, 2 Drawing Sheets

ATE THERMAL OVERLOAD DETECTION AND RECOVERY TECHNIQUES

CROSS-REFERENCE TO RELATED APPLICATIONS

This application claims the benefit of U.S. Provisional Patent Application No. 62/034,679 filed Aug. 7, 2014, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is the need to test components and systems, and diagnosing faults determined, during the testing.

Automatic test equipment (ATE) is commonly used to automatically test and diagnose faults in complex electronic components and systems. The ATE system and associated interface boards, probe cards, load, boards, handlers, environmental control systems and/or the like typically include numerous sensitive and costly electronic subsystems used to test a large number of devices under test (DUTs) serially or in parallel. The ATE system, associated systems and/or the DUTs may operate at or are subject to temperatures that may cause damage to the ATE system, interface boards and/or DUTs. The ATE system may be adapted to measure temperatures on the DUTs and/or interface board, and shut down testing if elevated temperatures are detected. However, there may be substantially latency in the ATE's ability to react to such conditions because it takes time for data related to temperatures on the DUT, probe card or the like to be captured, to be transmitted to the ATE, and for the ATE to perform the necessary calculations. Therefore, there is a continuing need for improved thermal overload detection and recovery techniques.

SUMMARY OF THE INVENTION

The present technology may best be understood by referring to the following description and accompanying drawings that are used to illustrate embodiments of the present technology directed toward automatic test equipment thermal overload detection and recovery techniques.

In one embodiment, an interface board, load board or the like that is communicatively coupled between the automated test equipment (ATE) and one or more devices under test (DUTs) includes a temperature monitor. The temperature monitor is adapted to receive a sensor temperature signal from a temperature sensor located on a DUT or the interface board. The temperature monitor compares a value corresponding to the sensor temperature signal to a predetermined temperature value. If the sensor temperature signal value exceeds the predetermined temperature, value, the temperature monitor is adapted to drive an alert signal to an asserted state which acts to turn off one or more power supplies of the ATE.

The interface board may also include a temperature activated switch that is coupled to the temperature monitor. The temperature activated switch is adapted to drive the alert signal to the asserted state when a temperature proximate the temperature activated switch raises above a threshold temperature of the temperature activated switch.

Alternatively, the temperature activated switch may be coupled to an emergency off (EMO) functional module of the ATE. In such case, the temperature activated switch is adapted to break a conductive chain of the EMO functional module when a temperature proximate the temperature activated switch raises above the threshold temperature of the temperature activated switch.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings at d in which like reference numerals refer to similar elements and in which.

DETAILED DESCRIPTION OF THE INVENTION

Figure 1:
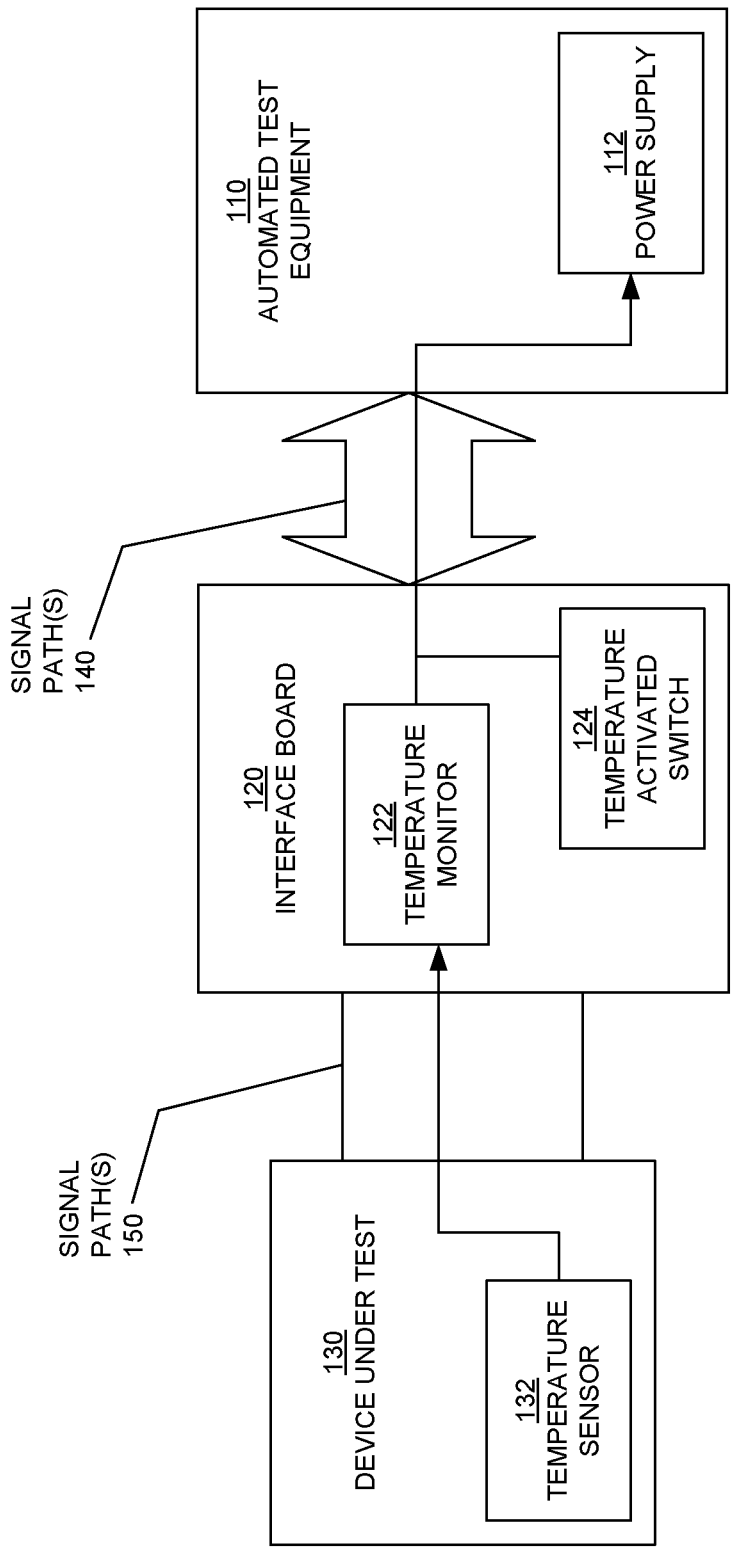
FIG. 1 shows a test system, in accordance with one embodiment of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, winch may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module logic block and/or the like, is herein, and generally, conceived to be a self-consistent sequence of processes or instructions leading to a desired result. The processes are those including physical manipulations of physical quantities. Usually, though not necessarily, the physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings and or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring to FIG. 1, a test system, in accordance with one embodiment of the present technology, is shown. The test system includes automated test equipment (ATE) 110 and an interface board, probe card, load board, handler or the like 120. The term interface board 120 will be used hereinafter to refer to an interface board, probe card, load board, handler or the like device for coupling one or more devices under test (DUT) to the ATE 110. The interface board 120 is communicatively coupled between the ATE 110 and a device under test (DUT) 130. The term DUT 120 as used herein refers to electronic device and components including, but not limited to wafers including a plurality of dies, individual dies, packaged dies, circuits, printed circuit board assemblies or the like. The interface board 120 is communicatively coupled to the ATE 110 by one Of more signal paths 140, typically including one or more cables. The interface board 120 is communicatively coupled to the DUT 130 by one or more signal paths 150, typically including one or more sockets, a plurality of pins, a ball grid array or the like adapted to electrically couple the interface board 120 to the DUT 130.

The ATE 110 is adapted to automatically test and diagnose faults in complex electronic components and systems. The ATE 110 may be adapted to test to single system or component at a time, or multiple components or systems at once. The ATE 110 typically includes a master controller that synchronized one or more functional modules. The functional modules may include power supplies, parametric measurement units, arbitrary waveform venerators, digital-to-analog converters, analog-to-digital converters, digital signal processors, input and output drivers, and the like. With regard to embodiment of the present technology the ATE 110 specifically includes one or more power supplies 112 for providing power to instruments of the ATE 110, the interface board 120 and functional modules thereon, and/or the one or more DUTs 130 coupled to the interface board 120. In an exemplary implementation, the ATE 110 may be a V93000 system on a chip (SoC) and high-speed memory test platform from Advantest®.

The DUT 130 may be any electrical component or system. The DUT 130 may also be referred to as a unit under test (UUT) or the like. With regard to embodiments of the present technology, the DUE 130 may include a temperature sensor 132. The temperature sensor 132 on the DUT 130 may preferably be located adjacent one or more components operating at elevated temperatures and/or adjacent one or more temperature sensitive components. In an exemplary implementation, the temperature sensor 132 may be a thermal diode, which provides an electrical signal (e.g., current) proportional to the temperature of the diode, herein after referred to as a sensor temperature signal, in an exemplary implementation, the DUT 130 may be a wafer of DRAM, individual DRAM die, packaged DRAM chips or DRAM memory cards.

The interface board 120 is adapted to act as a nodal point for signals between the ATE 110 and the DUT 130. The interface board 120 may be custom to the DUT 130 or a class of DUTs. The interface board 120 is used to make connection between the ATE 110 and the DUT 140. The interface board 120 may also provide functions additional to the ATE 110. For example the interface board 120 may include additional circuity to adapt signals between the ATE 110 and the DUT 120. The interface board 120 may also be referred to a mass interconnect, load board, probe card, attachment board, interface test adapter, DUT handler or the like.

With regard to embodiments of the present technology, the interface board 120 includes a temperature monitor 122, and optionally a temperature activated switch 124. The temperature monitor 122 may receive the sensor temperature signal from the temperature sensor 132 on the DUT 130. The temperature monitor 122 compares a value corresponding to the sensor temperature signal to a predetermined temperature value. If the corresponding sensor temperature signal value exceeds the predetermined temperature value, the temperature monitor 122 asserts (e.g., logic low) an alert signal, otherwise the alert signal is de-asserted (e.g., logic high).

If the DUT 130 does not include a temperature sensor, a temperature sensor may alternatively be included on the interface board 120 (not shown). The temperature sensor on the interface board 120 may preferably be located proximate one or more components on the OUT 130 operating at elevated temperatures and/or proximate temperature sensitive components of the DUT 130. The temperature sensor on the interface board 120 may, alternatively or in addition, be located adjacent the one or more signal paths 150 coupling the interface board 120 to the DUT 130. The temperature sensor on the interface board 120 may, alternatively or in addition, be located adjacent one or more components operating at elevated temperatures and/or adjacent one or more temperature sensitive components of the interface board 120. In an exemplary implementation, the temperature sensor may again be a thermal diode, which provides a sensor temperature signal. The temperature monitor 122 likewise compares a value corresponding to the sensor temperature signal received from the temperature sensor on the interface board 120 to a predetermined temperature value. If the corresponding sensor temperature signal value exceeds the predetermined temperature value, the temperature monitor 122 asserts (e.g., logic low) an alert signal, otherwise the alert signal is de-asserted (e.g., logic high).

The temperature monitor 122 may, alternatively or in addition include an integrated temperature sensor (not shown). In such case, the temperature monitor 122 may preferably be located, proximate one or more components on the DUT 130 operating at elevated temperatures and/or temperature sensitive components of the DUT 130. The temperature monitor 122 may, alternatively or in addition, be located adjacent the one or more signal paths 150 coupling the interface board 120 to the DUT 130. The temperature monitor 122 may, alternatively or in addition, be located, adjacent one or more components operating at elevated temperatures and/or adjacent one or more temperature sensitive components of the interface board 120. The temperature monitor 122 likewise compares a value corresponding to the sensor temperature signal generated by its internal temperature sensor to a predetermined temperature value. If the corresponding sensor temperature signal value exceeds the predetermined temperature value, the temperature monitor 122 asserts (e.g., logic low) an alert signal, otherwise the alert signal is de-asserted (e.g., logic high).

In an exemplary implementation, the temperature monitor 120 may be an ADT7461 temperature monitor from Analog Devices®, ON Semiconductor®, or the like. The supply pin $V_{DD}$ may be coupled to a supply potential voltage, the GND pin may be coupled to a ground potential voltage. The temperature sensor may be coupled between the D+ and D− pins. The predetermined, temperature value may be input to the ADT7461 temperature monitor on the SDATA pin with the use of a clock signal input on the SCLK pin. The ALERT/pin of the ADT7461 temperature monitor may coupled to the ultra-high current 4 (UHC4) device power supply safety line of the V93000 SoC and high-speed memory test platform.

The optional temperature activated switch 124, of the interface board 120, may be configured to selectively pull the alert signal of the temperature monitor 122 to a de-asserted state (e.g., logic low). The temperature activated switch 124 may preferably be located proximate one or more components on the DUT 130 operating at elevated temperatures and/or proximate temperature sensitive components of the DUT 130. The temperature activated switch 124 may alternatively or in addition, be located adjacent the one or more signal paths 150 coupling the interface board 120 to the DUT 130. The temperature activated switch 124 may, alternatively or in addition, be located adjacent one or more components operating at elevated temperatures on the interlace board 120 and/or adjacent one or more temperature sensitive components on the interface board 120. When the temperature proximate the temperature activated switch 124 is below a threshold temperature of the temperature activated switch 124, the temperature monitor 122 operates as described above. However, when the temperature proximate the temperature activated switch 124 climbs above the threshold temperature, the temperature activated switch 124 pulls the alert signal to a asserted state (e.g., logic low) effectively overriding the operation of the temperature monitor 122.

In an exemplary implementation, the temperature activated switch 124 may be a 2455RA series heat detection thermostat from Honeywell Sensing and Control®. The 2455RA series heat detection thermostat may be coupled to the ALERT/pin of the ADT7461 temperature monitor, with a resistive pull up to the supply potential voltage of the ADT7461 temperature monitor.

The alert signal generated by the temperature monitor 122 is coupled to one or more power supplies 112 of the ATE 110. The alert signal controls the operation of the one or more power supplies 112. For example, the power supply 112 of the ATE provides one or more supply potential voltages to one or more functional circuit blocks of the ATE 110, the DUT 130 through the interface board 120, and/or the one or more functional circuit blocks of the interface board 120, when the alert signal is de-asserted (e.g., logic high). When the alert signal is asserted, the power supply 112 turns off one or more supply potential voltages to one or more functional circuit blocks of the ATE 110, the DUT 130 through the interface board 120, and/or the one or more functional circuit blocks of the interface board 120. Accordingly, the alert signal advantageously turns off power during a high temperature condition to protect the ATE 110, the interface board 120, the DUT 130 and/or arty other related systems such as DUT handlers and environmental control systems from damage.

In an exemplary implementation, the ALERT/pin of the ADT7461 temperature monitor is coupled to the UHC4 safety line of the V93000 SoC and high-speed memory test platform. The UHC4 safety line turns off one or more digital power supplies of the V93000 SoC and high-speed memory test platform, when the signal on the UHC4 safety line is asserted (e.g., logic low).

Figure 2:
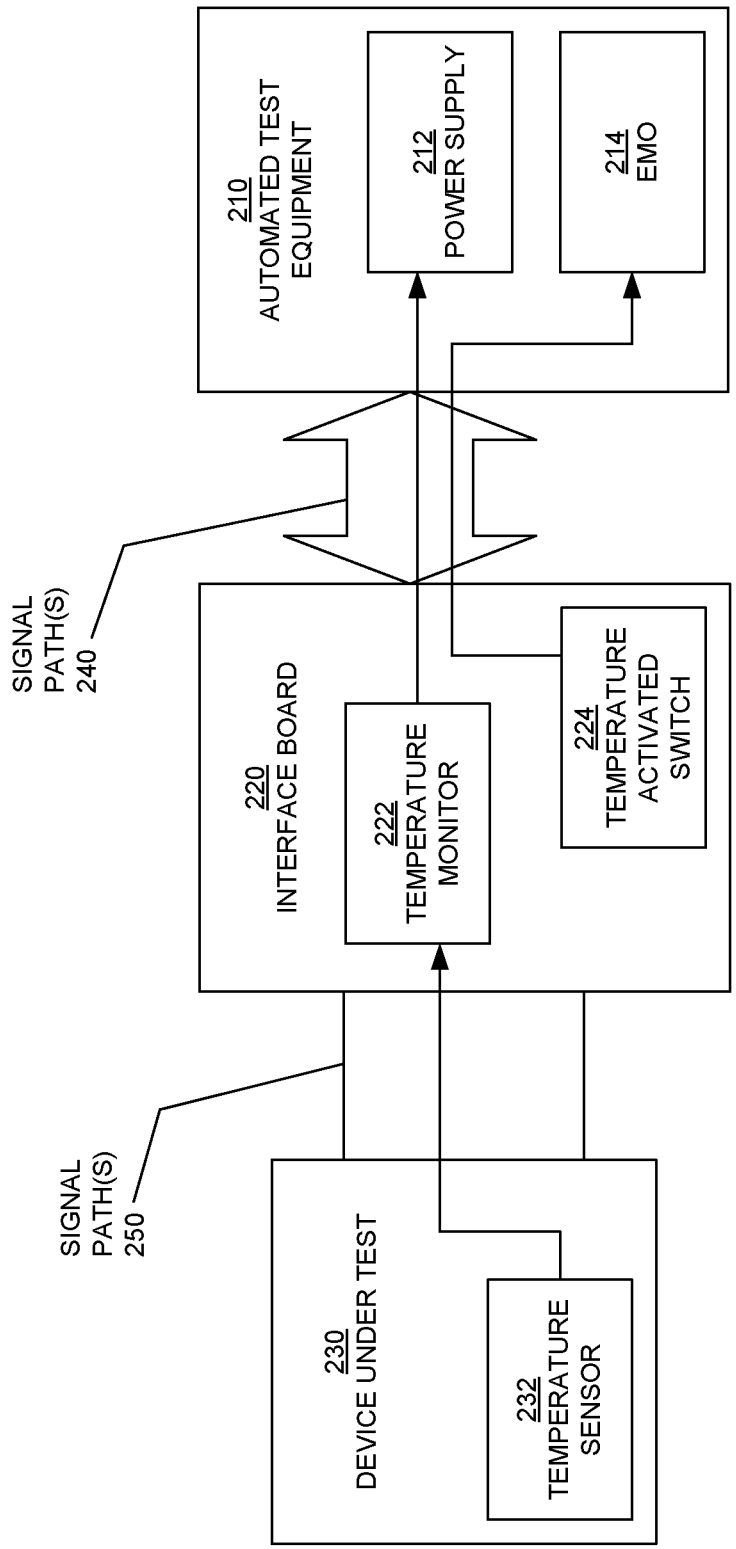
FIG. 2 shows a test system, in accordance with another embodiment of the present technology.

Referring now to FIG. 2, a test system, in accordance with another embodiment of the present technology, is shown. The test system again includes automated test equipment (ATE) 210 and an interface board 220. The interface board 220 is communicatively coupled between the ATE 210 and a device under test (DUT) 230. The interface board 220 is communicatively coupled to the ATE 210 by one or more signal paths 240, typically including one or more cables. The interface board 220 is communicatively coupled to the DUT 230 by one or more signal paths 250, typically including one or more sockets, a plurality of pins, a ball grid array Or the like. The test system in FIG. 2 is similar to the test system described with reference to FIG. 1. Therefore, those portions of the two systems that are substantially similar will not be repeated. Only those portions of the test system in FIG. 2 that differ from the test system in FIG. 1 will be set forth herein.

The ATE 210 includes one or more power supplies 212 and an emergency off (EMO) functional module. The power supply 212 provides power to instruments of the ATE 210, the interface board 220 and functional modules thereon, and the one or more DUTs 230 coupled to the interface board 220. The EMO functional module is a safety mechanism used to shut off the ATE and other associated devices such as environmental control system, DUT handler. The EMO functional module may also be referred to as an emergency shut-off, emergency stop, e-stop, or the like.

The interface board 220 includes a temperature monitor 222 and a temperature activated switch 224. The temperature monitor 222 may receive the sensor temperature signal from a temperature sensor 232 on the DUT 230, a temperature sensor on the interface board 220 or a temperature sensor integral to the temperature monitor 222. The temperature monitor 222 compares a value corresponding to the sensor temperature signal from an applicable temperature sensor to a predetermined temperature value. If the corresponding sensor temperature signal value exceeds the predetermined temperature value, the temperature monitor 222 asserts (e.g., logic low) an alert signal, otherwise the alert signal is de-asserted (e.g., logic high).

The alert signal generated by the temperature monitor 222 is coupled to one or more power supplies 212 of the ATE 210 to control the operation of the one or more power supplies 212. For example, the power supply 212 of the ATE provides one or more supply potential voltages to one or more functional circuit blocks of the ATE 210, the DUT 230 through the interface board 220, and/or the one or more functional circuit blocks of the interface board 220, when the alert signal is de-asserted (e.g., logic high). When the alert signal is asserted, the power supply 212 turns off one or more supply potential voltages to one or more functional circuit blocks of the ATE 210, the DUT 230 through the interface board 220, and/or the one or more functional circuit blocks of the interface board 220. Accordingly, the alert signal advantageously turns off power during a high temperature condition to protect the ATE 110, the interface board 120, the DUT 130, the environmental control system the DUT handler and/or the like from damage.

In an exemplary implementation, the ALERT/pin of the ADT7461 temperature monitor is coupled to the UTICA safety line of the V93000 SoC and high-speed memory test platform. The UHC4 safety line turns off one or more digital power supplies of the V93000 SoC and high-speed memory test platform, when the signal on the UHC4 safety line is asserted (e.g., logic low) during a high temperature event that may damage the V93000 ATE 210, the DUTs 230 and/or interface board 220.

The temperature activated switch 224, of the interface board 220, is coupled to the Emergency Off (EMO) functional module 214 of the ATE 210. The temperature activated switch 124 may preferably be located proximate one or more components on the DUT 230 operating at elevated temperatures and/or proximate temperature sensitive components of the DUT 230. The temperature activated switch 224 may, alternatively or in addition, be located adjacent the one or more signal paths 250 coupling the interface board 220 to the DUT 230. The temperature activated switch 224 may, alternatively or in addition, be located adjacent one or more components operating at elevated temperatures on the interface board 220 and/or adjacent one or more temperature sensitive components on the interface board 220. The temperature activated switch 224 may be looped into (e.g., connected in series) the EMO functional module. When the temperature proximate the temperature activated switch 224 raises above a threshold temperature of the temperature activated switch 224, the normally closed contact of the temperature activated switch 224 opens to break a conductive chain of the EMO functional module 214. The when the conductive chain is broken by activation (e.g., open state of switch) of the temperature activated switch 224 the EMO functional module 214 shuts down the ATE 210 and any number of other test associated equipment such as an environmental control system, DUT handler or the like. In this embodiment, the temperature activated switch 224 provides a second independent over temperature protection technique, as a redundancy to the above described temperature monitor 220.

In an exemplary implementation the temperature activated switch may be a 2455RA series heat detection thermostat from Honeywell Sensing and Control®. The 2455RA series heat detection thermostat may be coupled on the J201 interlock pins 1 and 2 of the V93000 SoC Or high-speed memory test platform.

Although embodiments of the present technology have been explained above with reference to a single DUT 130, 230, coupled to an interface board 120, 220, it is appreciated that embodiments may readily be adapted to embodiments wherein multiple DUTs are coupled to the interface board 120, 220. In such embodiments, the interface board 120 may include a temperature monitor 112, 222, optionally a temperate sensor 132, 232, and optionally a temperature activated switch 124, 224, or combinations thereof for each DUT coupled to the interface board 120, 220. In another embodiment, a temperature monitor 112, optionally a temperate sensor 132, 232, and optionally a temperature activated switch 124, 224, or combinations thereof may be provided for groups of DUTs coupled to the interface board 120, 220.

Embodiments of the present technology advantageously provide real time temperature feedback and protection to automatic test equipment, associated interface board and/or devices under test. The protection provided by embodiments of the present technology operate without the ATE having to make such temperature measurements. Accordingly embodiments of the present technology advantageously function autonomously to monitor and act on temperature boundary crossings to prevent equipment damage and possible bodily harm to operators thereof.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the are to best utilize the present technology and various embodiments with various modifications as are suited to the particular use contemplated. It is intended, that the scope of the invention be defined by the claims appended hereto and their equivalents.

What is claimed is:

1. An apparatus comprising:
   an automated test equipment including a power supply;
   an interface board, communicatively coupled to the automated test equipment, including a temperature monitor, wherein the temperature monitor,
   receives a sensor temperature signal received from a temperature sensor;
   compares a value corresponding to the sensor temperature signal to a predetermined temperature value; and
   drives an alert signal to an asserted state as the sensor temperature signal value exceeds the predetermined temperature value; and
   wherein the alert signal is coupled to the power supply to turn off the power supply when the alert signal is in the asserted state.

2. The apparatus of claim 1, wherein the temperature sensor is disposed on a device under test and is located adjacent one or more components operating at elevated temperatures or adjacent one or more temperature sensitive components on the device under test.

3. The apparatus of claim 1, wherein the temperature sensor is disposed on the interface board and is located proximate one or more components operating at elevated temperatures or proximate one or more temperature sensitive components on the device under test.

4. The apparatus of claim 1, wherein the temperature sensor is disposed on the interface board and is located adjacent one or more interfaces coupling the interface board to the device under test.

5. The apparatus of claim 1, wherein the temperature sensor is disposed on the interface board and is located adjacent one or more components operating at elevated temperatures or adjacent one or more temperature sensitive components on the interface board.

6. The apparatus of claim wherein the temperature sensor is integral to the temperature monitor.

7. The apparatus of claim 6, wherein the temperature monitor is located proximate one or more components operating at elevated temperatures or proximate one or more temperature sensitive components on the device under test.

8. The apparatus of claim 6, wherein the temperature monitor is located adjacent one or more interfaces coupling the interface board to the device under test.

9. The apparatus of claim 6, wherein the temperature monitor is located adjacent one or more components operating at elevated temperatures or adjacent one or more temperature sensitive components on the interface board.

10. The apparatus of claim 1, wherein the interface board further includes a temperature activated switch coupled to the temperature monitor, wherein the temperature activated switch drives the alert signal to the asserted state when a temperature proximate the temperature activated switch raises above a threshold temperature of the temperature activated switch.

11. The apparatus of claim 10 wherein the temperature activated switch is located proximate one or more components operating at elevated temperatures or proximate one or more temperature sensitive components on the device under test.

12. The apparatus of claim 10, wherein the temperature activated switch is located adjacent one or more interfaces coupling the interface board to the device under test.

13. The apparatus of claim 10, wherein the temperature activated switch is located adjacent one or more components operating at elevated temperatures or adjacent one or more temperature sensitive components on the interface board.

14. The apparatus of claim 1 wherein
the automated test equipment further includes an emergency off functional module, and
the interface board further includes a temperature activated switch coupled to the emergency off functional module, wherein the temperature activated switch breaks a conductive chain of the emergency off functional module when a temperature proximate the temperature activated switch raises above a threshold temperature of the temperature activated switch.

15. The apparatus of claim 14, wherein the temperature activated switch is located proximate one or more components operating at elevated temperatures or proximate one or more temperature sensitive components on the device under test.

16. The apparatus of claim 14, wherein the temperature activated switch is located adjacent one or more interfaces coupling the interface board to the device under test.

17. The apparatus of claim 14, wherein the temperature activated switch is located adjacent one or more components operating at elevated temperatures or adjacent one or more temperature sensitive components on the interface board.

18. An apparatus comprising:
an automated test equipment including a power supply;
an interface board, communicatively coupling the automated test equipment and a device under test, wherein the interface board includes a temperature monitor having,
a means for comparing a value corresponding to a sensor temperature signal received from a temperature sensor to a predetermined temperature value, wherein the temperature sensor is located proximate one or more components operating at elevated temperatures or proximate one or more temperature sensitive components on the interface board or the device under test, and
a means for turning off the power supply as the sensor temperature signal value exceeds the predetermined temperature value and comprising a means for issuing an alert signal that turns off the power supply when the alert signal is asserted.

19. The apparatus of claim 18, wherein the interface board further has a means for further turning of the power supply when a temperature proximate one or more components operating at elevated temperatures or proximate one or more temperature sensitive components on the interface board or the device under test raises above a threshold temperature.

20. The apparatus of claim 18, wherein,
the automated test equipment further includes an emergency functional module; and
the interface board further has a means for breaking a conductive chain of the emergency functional module when a temperature proximate one or more components operating at elevated temperatures or proximate one or more temperature sensitive components on the interface board or the device under test raises above a threshold temperature.

* * * * *